(12) United States Patent
Yeo et al.

(10) Patent No.: US 7,202,139 B2
(45) Date of Patent: Apr. 10, 2007

(54) MOSFET DEVICE WITH A STRAINED CHANNEL

(75) Inventors: Yee-Chia Yeo, Albany, CA (US); Fu Liang Yang, Hsin-Chu (TW); Chen Ming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/068,928

(22) Filed: Feb. 7, 2002

(65) Prior Publication Data

US 2005/0003599 A1 Jan. 6, 2005

(51) Int. Cl.
*H01L 21/22* (2006.01)
*H01L 21/38* (2006.01)

(52) U.S. Cl. ...................... 438/455; 438/458
(58) Field of Classification Search .......... 438/58, 438/60, 143, 149, 150, 151, 152, 153, 154, 438/310–311, 402, 471, 478, 494, 751, 455, 438/458–459
See application file for complete search history.

(56) References Cited

U.S. PATENT DOCUMENTS

| | | | | |
|---|---|---|---|---|
| 4,142,925 A | * | 3/1979 | King et al. | 438/60 |
| 4,771,016 A | * | 9/1988 | Bajor et al. | 438/455 |
| 5,013,681 A | * | 5/1991 | Godbey et al. | 438/459 |
| 5,234,535 A | * | 8/1993 | Beyer et al. | 438/459 |
| 5,344,524 A | * | 9/1994 | Sharma et al. | 438/459 |
| 5,659,187 A | | 8/1997 | Legoues et al. | 257/190 |
| 5,705,421 A | * | 1/1998 | Matsushita et al. | 438/459 |

(Continued)

FOREIGN PATENT DOCUMENTS

TW 447018 7/2001

OTHER PUBLICATIONS

Yang-Kyu Choi et al., "*Ultrathin-Body SOI MOSFET for Deep-Sub-Tenth Micron Era*", IEEE Electron Device Letters, vol. 21, No. 5, May 2000, pp. 254-255.

(Continued)

*Primary Examiner*—Theresa T. Doan
(74) *Attorney, Agent, or Firm*—Haynes and Boone, LLP

(57) ABSTRACT

An ultra thin MOSFET device structure located on an insulator layer, and a method of forming the ultra thin MOSFET device structure featuring a strained silicon channel located on the underlying insulator layer, has been developed. After epitaxial growth of a semiconductor alloy layer such as silicon-germanium (SiGe), on a first semiconductor substrate, a strained silicon channel layer, under biaxial tensile strain, is epitaxially grown on the underlying semiconductor alloy layer. Bonding of the strained silicon channel layer of the first semiconductor substrate, to a silicon oxide layer located on the surface of a second semiconductor substrate, is followed by a cleaving procedure performed at the interface of the strained silicon channel layer and the underlying semiconductor alloy layer, resulting in the desired configuration comprised of strained silicon channel layer-underlying insulator layer-second semiconductor substrate. The MOSFET device is then formed featuring the strained silicon channel layer, on the underlying silicon oxide layer, with enhanced carrier mobility realized as a result of the biaxial tensile strain of the silicon channel layer.

21 Claims, 3 Drawing Sheets

U.S. PATENT DOCUMENTS

| | | | |
|---|---|---|---|
| 5,891,769 A | 4/1999 | Liaw et al. | 438/167 |
| 5,906,951 A | 5/1999 | Chu et al. | 438/751 |
| 6,013,563 A * | 1/2000 | Henley et al. | 438/458 |
| 6,165,837 A | 12/2000 | Kawakubo et al. | 438/244 |
| 6,221,738 B1 * | 4/2001 | Sakaguchi et al. | 438/455 |
| 6,291,321 B1 | 9/2001 | Fitzgerald | 438/494 |
| 6,313,016 B1 | 11/2001 | Kibbel et al. | 438/478 |

OTHER PUBLICATIONS

Yang-Kyu Choi et al., "*30nm Ultra-Thin-Body SOI MOSFET with Selectively Deposited Ge Raised S/D*", Device Research Conference, Denver, Co., Jun. 2000, pp. 23-24.

Hon-Sum Wong et al. "*Three-Dimensional 'Atomistic' Simulation of Discrete Random Dopant Distribution Effects in Sub-0.1 um MOSFET's*", International Electron Device Meeting Tech. Digest, Dec. 1993, pp. 705-708.

L.-J. Huang et al, "*Carrier Mobility Enhancement in Strained Si-On-Insulator Fabricated by Wafer Bonding*", 2001 Symposium on VLSI Technology Digest of Technical Papers, Kyoto, Japan, Jun. 2001, pp. 57-58.

Kern (KEN) Rim et al., "*Fabrication and Analysis of Deep Submicron Strained-Si N-MOSFETS*", IEEE Transactions on Electron Devices, vol. 47, No. 7, Jul. 2000, pp. 1406-1415.

Michael I. Current et al., "*Atomic-layer Cleaving with $Si_x Ge_y$ Strain Layers for Fabrication of Si and Ge-rich Device Layers*", 2001 IEEE International SOI Conference, Oct. 2001, pp. 11-12.

* cited by examiner

MOSFET DEVICE WITH A STRAINED CHANNEL

BACKGROUND OF THE INVENTION (1) Field of the Invention

The present invention relates to methods used to fabricate semiconductor devices, and more specifically to a method used to fabricate a metal oxide semiconductor field effect transistor (MOSFET) device on an insulator layer, featuring a strained channel.

(2) Description of Prior Art

In order to suppress short channel effects as the gate length of metal oxide semiconductor field effect transistor (MOSFET) devices are scaled down, higher body doping concentrations, thinner gate insulator layers, and shallower source/drain doping profiles are necessary. Such requirements have become difficult to meet when conventional device structures based on bulk silicon substrates are employed. The heavy channel doping required to provide adequate suppression of short channel effects result in degraded mobility and enhanced junction leakage. In addition the reduction of gate insulator thickness, to minimize short channel effects, leads to direct tunnelling gate leakage current as well as raising concerns regarding gate insulator reliability.

A method of suppressing short channel effects is the format ion of a MOSFET device featuring an ultra thin silicon layer as the channel region, located on an insulator structure. In this type of structure the source to drain current is restricted to flow only in the region close to the gate, in the ultra thin channel silicon layer, grown to a thickness typically less than 200 Angstroms. Since this configuration does not rely on a heavily doped channel region for suppression of short channel effects it avoids the problems of mobility degradation due to impurity scattering and threshold voltage fluctuation due to random variation of the number of dopant atoms in the channel region. As a ultra thin source/drain region would contribute high series resistance a raised source/drain structure can be employed to avoid the series resistance problem.

Performance optimization of an ultra thin body MOSFET device is possible through the use of a strained channel region, where the strain modifies the band structure of the channel region resulting in enhanced carrier transport properties. However the implementation of a MOSFET device on an insulator structure, featuring a strained channel region is difficult to achieve via conventional processes, and therefore not previously addressed. The present invention will however describe a novel fabrication process sequence is which a silicon channel region, under biaxial tensile strain, is successfully employed as a component for a MOSFET device, where the silicon channel region is located in a thin silicon layer which in turn is located on an insulator structure. Prior art such as: Kibbel et al, in U.S. Pat. No. 6,313,016; Liaw et al, in U.S. Pat. No. 5,891,769; Chu et al, in U.S. Pat. No. 5,906,951; Fitzgerald et al, in U.S. Pat. No. 6,291,321; and Leoues et al, in U.S. Pat. No. 5,659,187; have described methods of forming strained semiconductor and semiconductor alloys, on insulator structures. These prior arts however do not describe the novel process sequence used in this present invention, in which a thin, strained silicon layer is obtained on an underlying insulator structure.

SUMMARY OF THE INVENTION

It is an object of this invention to form a strained channel on an insulator structure, for use in an ultra-thin body MOSFET device.

It is another object of this invention to form a strained channel in a silicon layer under biaxial tensile strain, obtained via growth of the silicon layer on an underlying relaxed layer or substrate with a natural lattice constant larger than that of silicon.

It is still another object of this invention to bond a first wafer comprised with the silicon strained channel, to a second wafer comprised with an insulator structure, followed by a cleaving procedure removing the underlying relaxed layer from the first wafer and resulting in a third wafer comprised of the strained silicon channel (from first wafer) on an insulator structure (from second wafer).

In accordance with the present invention a method of forming an ultra thin MOSFET device on an insulator structure, featuring a strained channel, is described. A first wafer comprised of a semiconductor alloy layer, such as silicon-germanium (SiGe), or silicon-germanium-carbon (SiGeC), with a lattice constant larger than that of silicon, is formed on an underlying semiconductor substrate. With the semiconductor in a relaxed state, a thin silicon layer is epitaxially grown resulting in a first wafer comprised of a thin silicon layer overlying the underlying semiconductor alloy layer, on the semiconductor substrate. A second wafer comprised of an insulator layer on a semiconductor substrate is prepared and then bonded to the first wafer resulting in a third wafer featuring the thin silicon layer of the first wafer directly overlying the insulator layer of the second wafer. A cleaving procedure is employed to separate the thin silicon layer from the underlying semiconductor alloy layer of the first wafer, resulting in a fourth wafer with the desired configuration of the thin silicon layer from the first wafer, under biaxial tensile strain, located on the insulator layer which in turn is located on the underlying semiconductor substrate from the second wafer. Formation of a gate insulator layer on the thin silicon layer, is followed by definition of a gate structure. Formation of insulator spacers on the sides of the gate structure, and growth, or definition of a raised source/drain structure, complete the fabrication of a ultra thin MOSFET device, featuring a silicon channel region under biaxial tensile strain, on an underlying insulator structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
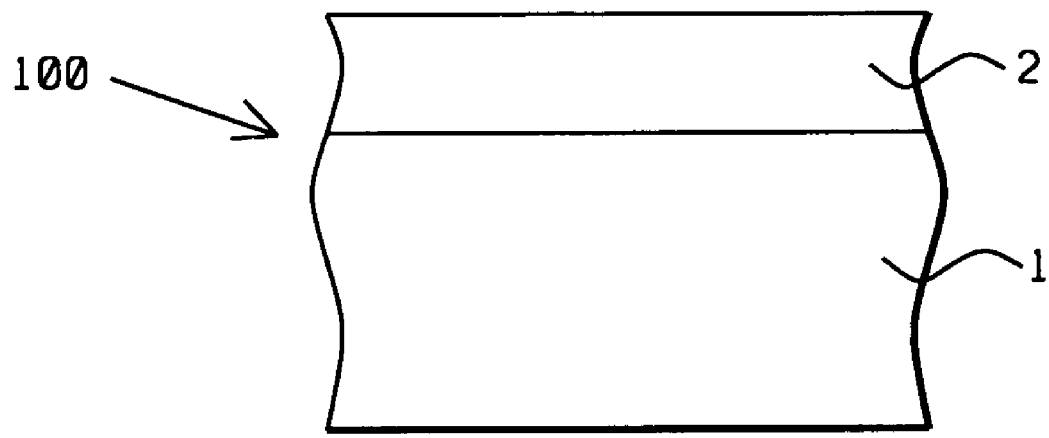
FIGS. 1–6, which schematically, in cross-sectional style, describe key stages used to fabricate an ultra thin MOSFET device, featuring a silicon channel region under biaxial tensile strain, located directly on an underlying insulator structure.

The method of fabricating a MOSFET device, featuring a thin silicon channel under biaxial strain, located on an underlying insulator structure, will now be described in detail. A first semiconductor substrate 1, comprised of single crystalline silicon, with a <100> crystallographic orientation, is provided and shown schematically in FIG. 1. A material comprised with a natural lattice constant greater than that of silicon is next formed on first semiconductor substrate 1. The natural lattice constant of a material is its lattice constant in the relaxed state. Layer 2, a material with a natural larger lattice constant than that of silicon, can be a silicon-germanium (SiGe), layer, or a silicon-germanium-carbon (SiGeC) layer. The SiGe option is accomplished via epitaxial growth at a temperature between about 400 to 800° C., using silane, or disilane as a source for silicon, while using germane as a source for germanium. The thickness of SiGe layer 2, is between about 0.1 to 10 microns, with a fraction of germanium between about 0.05 to 0.8. The growth conditions used for layer 2, result in a relaxed SiGe layer on silicon semiconductor substrate 1. If desired layer 2, can be comprised of SiGeC, again obtained via epitaxial growth conditions at a temperature between about 400 to 800° C. Again silane, or disilane, and germane are used as reactants, with the addition of a hydrocarbon as a source for carbon. Layer 2, comprised of SiGeC, at a thickness between about 0.1 to 10 microns, is comprised with a germanium content between about 5 to 80%, and with a carbon content between about 0 to 4%, with the SiGeC layer again being in a relaxed condition. Therefore first wafer 100, shown schematically in FIG. 1, is now comprised of a relaxed layer 2, on semiconductor substrate 1.

Figure 2:
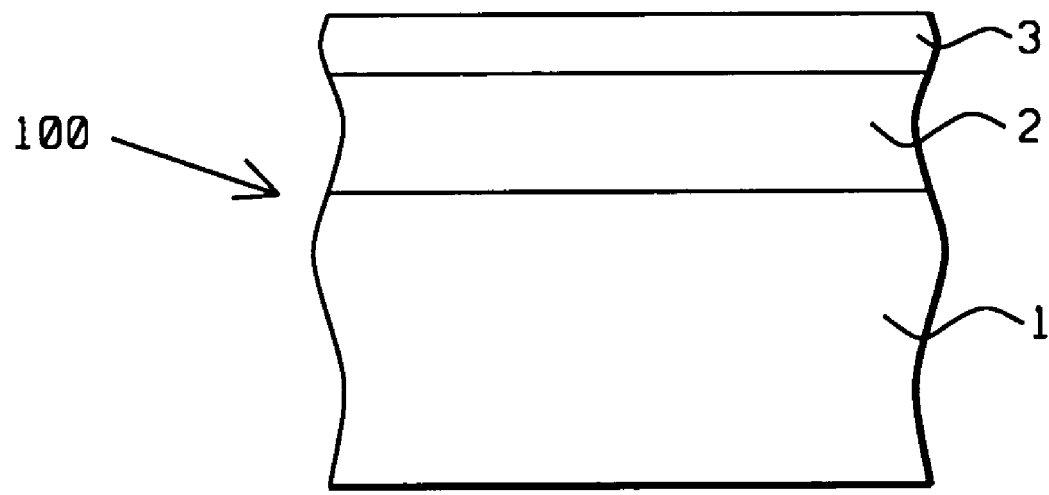

Layer 3, comprised of a strained layer of silicon, is next epitaxially grown on the top surface of relaxed layer 2. Silicon layer 3, is grown at a temperature between about 400 to 800° C., using silane or disilane as a silicon source. Layer 3, or strained silicon layer 3, is grown to a thickness between about 20 to 1000 Angstroms. First wafer 100, shown schematically in FIG. 2, is now comprised of strained silicon layer 3, on relaxed semiconductor alloy layer 2, on silicon semiconductor substrate 1. The lattice constant of layer 2, is larger than that of strained silicon layer 3.

Figure 3:
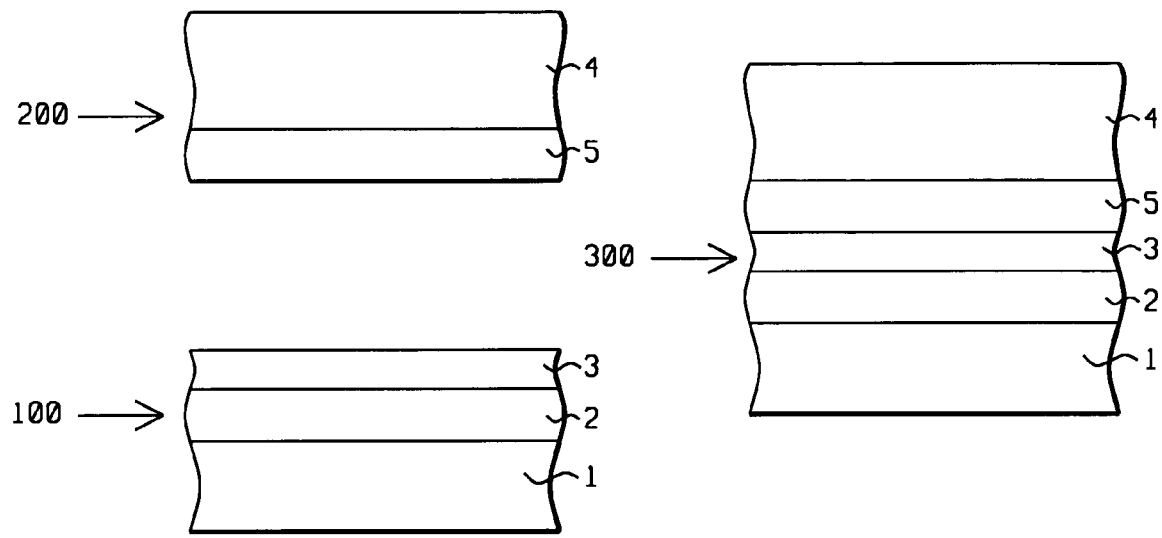

Second semiconductor 4, comprised of P type single crystalline silicon, with a <100> crystallographic orientation, is used as the substrate for second wafer 200, shown schematically in FIG. 3. Insulator layer 5, such as silicon dioxide, is next thermally grown on second semiconductor substrate 4, at a thickness between about 500 to 5000 Angstroms, via thermal oxidation procedures, performed at a temperature between about 800 to 1100° C., in an oxygen-steam ambient. Insulator layer 5, can also be a silicon oxide layer, obtained via low pressure chemical vapor deposition (LPCVD), or plasma enhanced chemical vapor deposition (PECVD), procedures, at a thickness between about 500 to 5000 Angstroms, using tetraethylorthosilicate (TEOS), as a source. In addition, if desired insulator layer 5, can be comprised of silicon nitride, obtained at a thickness between about 500 to 5000 Angstroms, using silane and ammonia as reactants. Second wafer 200, is now comprised of insulator layer 5, on semiconductor substrate 4. Bonding of first wafer 100 to second wafer 200, is next performed using wafer bonding procedures, resulting in third wafer 300, comprised of semiconductor substrate 4, insulator layer 5, strained silicon layer 3, semiconductor alloy layer 2, and semiconductor substrate 1. The wafer bonding procedure can be a direct bonding process. In the direct bonding process, two ultra clean wafers are mated at room temperature followed by subsequent anneal to increase the bond strength. The bond strength increases with the annealing temperature which can be between about 200 to 1100° C. This is schematically shown in FIG. 3.

Figure 4:
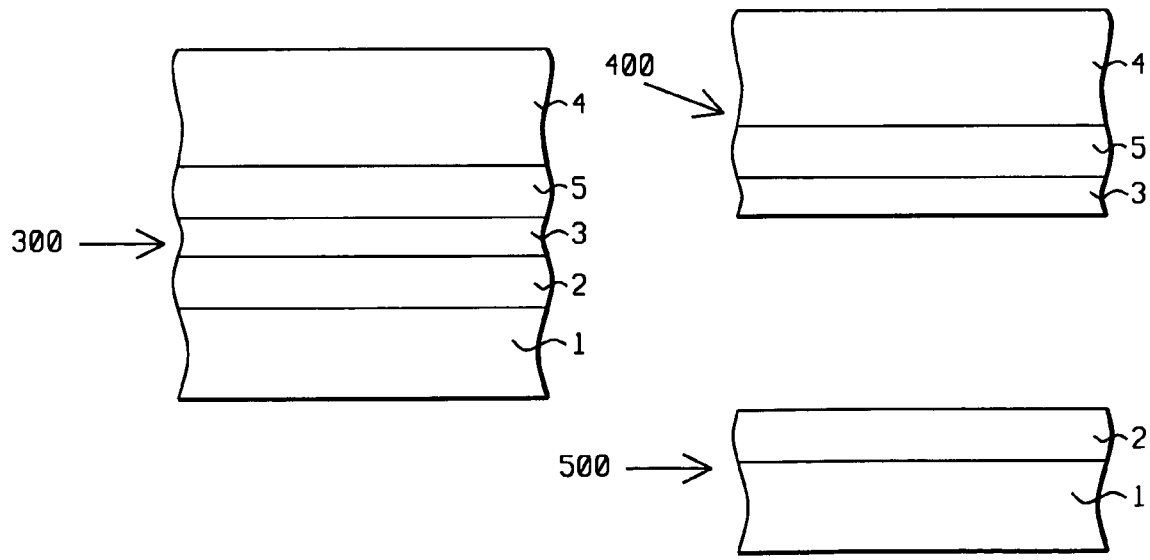

Referring to third wafer 300, a large strain gradient exists at the interface between strained silicon layer 3, and relaxed semiconductor alloy, or SiGe layer 2. The large strain gradient allows a cut or a cleave to be accomplished at this interface resulting in the desired SOI configuration presented by fourth wafer 400, comprised of strained silicon layer 3, on insulator layer 5, with the SOI region residing on semiconductor substrate 4. The combination of a thin silicon layer, under biaxial tensile strain, on an insulator layer, provides the configuration needed to fabricate the ultra thin MOSFET device featuring enhanced carrier mobility in the stained channel region, with a reduced risk of short channel effects a result of the thin silicon layer overlying an insulator layer. This is schematically shown in FIG. 4. Remaining fifth wafer 500, now comprised of semiconductor alloy layer 2, on semiconductor substrate 1, can be reclaimed and reused if desired. The cleaving procedure is done by providing energy the interface between strained silicon layer 3, and relaxed semiconductor alloy, or SiGe layer 2, such as using compressed air, pressurized fluid, or water jet. This is a controlled cleaving action at the interface whereupon the cleaving action is made using a propagating cleave front to separate the strained silicon layer 3, from the relaxed semiconductor alloy, or SiGe layer 2.

Figure 5:
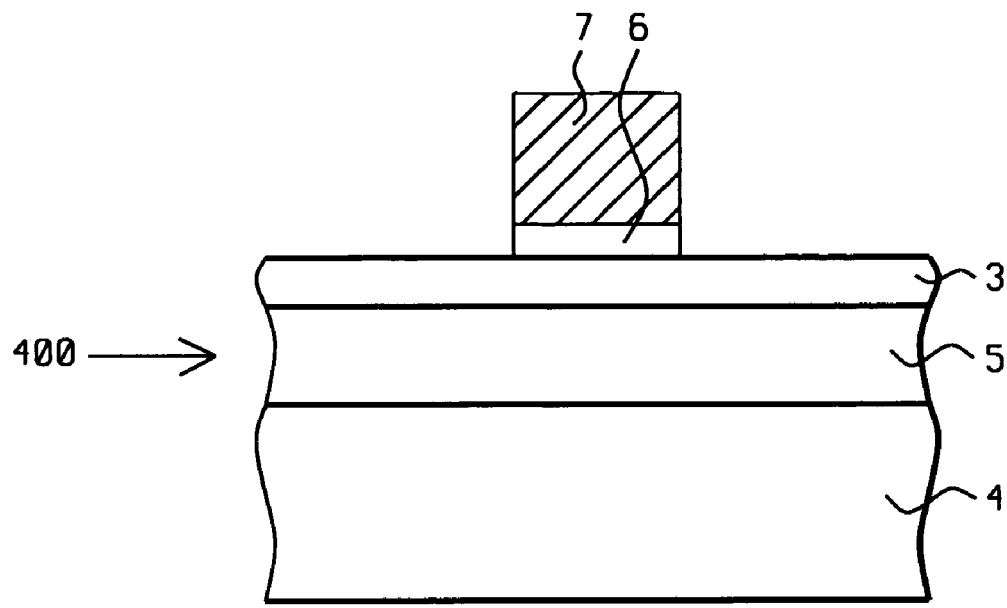
Figure 6:
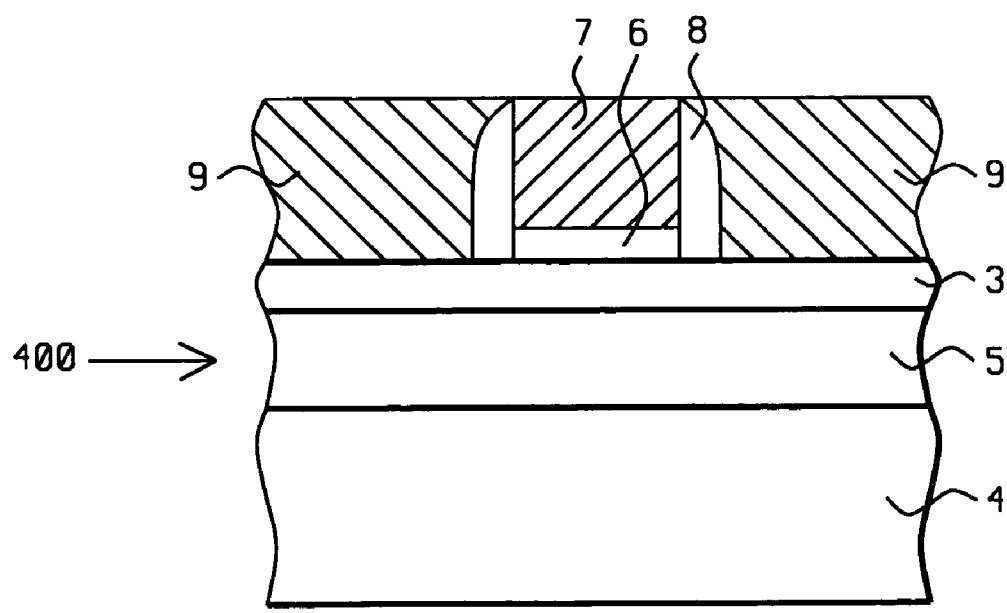

The fabrication of the ultra thin MOSFET device, on fourth wafer 400, featuring an SOI structure which in turn features a thin, strained silicon component, is next described and schematically illustrated using FIGS. 5–6. Gate insulator layer 6, comprised of silicon dioxide is obtained at a thickness between about 5 to 50 Angstroms, via thermal oxidation procedures performed at a temperature between about 600 to 1000° C., in an oxygen-steam ambient. The thermal growth of silicon dioxide gate insulator layer 6, consumes a top portion of strained silicon layer 3. Gate structure 7, comprised of polysilicon, or a polycide (metal silicide on polysilicon), is next formed via deposition of a polysilicon, (or a metal silicide-polysilicon), layer, via LPCVD procedures, to a thickness between about 500 to 2000 Angstroms. The polysilicon, or the polysilicon component of the polycide layer, can be doped in situ during deposition via the addition of arsine, or phosphine to a silane ambient, or the polysilicon or polysilicon component of the polycide layer, can be deposited intrinsically then doped via implantation of arsenic or phosphorous ions. The metal silicide layer, such as a cobalt silicide layer, used with the polycide option, can be deposited via LPCVD procedures after the polysilicon component has been deposited and doped. A photoresist shape, not shown in the drawings, is next used as a mask to allow an anisotropic, reactive ion etching (RIE) procedure, to define gate structure 7, shown schematically in FIG. 5. The RIE procedure is performed using $Cl_2$ or $SF_6$ as a selective etchant for polysilicon or polycide. Removal of the photoresist shape, used for definition of gate structure 7, is accomplished using plasma oxygen ashing procedures, followed by a wet clean procedure. The wet clean procedure employs a buffered hydrofluoric acid dip, which removes the portions of silicon dioxide gate insulator layer 6, not covered by gate structure 7.

If a source/drain region were to only be formed in the thin strained silicon layer high series resistance degrading drive current would occur. Therefore to avoid these deleterious effects a raised source/drain structure is formed and schematically shown in FIG. 6. First, insulator spacers 8, are formed on the sides of gate structure 7, via deposition of an insulator layer such as silicon oxide, or silicon nitride. The silicon oxide or silicon nitride layer is obtained via LPCVD or PECVD procedures, at a thickness between about 100 to 1000 Angstroms. Another selective, anisotropic RIE procedure is employed, using $CHF_3$ or $CF_4$ as a selective etchant for the insulator layer, resulting in the formation of insulator spacers 8, on the sides of gate structure 7. Formation of raised source/drain structure 9, is addressed, using either a deposited, then etched polysilicon option, or a selectively grown single crystalline silicon option. A first option employs the selective growth of single crystalline silicon, originating from the top surface of exposed portions of strained silicon layer 3, and extending to a height of between about 50 to 1000 Angstroms. The selective silicon growth does may or may not occur on the top surface of polysilicon gate structure 7. Raised silicon source/drain structure 9, is doped in situ during deposition, or grown intrinsically then doped via ion implantation procedures. The polysilicon option begins with a deposition of a polysilicon layer, via LPCVD procedures, to a thickness between about 500 to 4000 Angstroms, at a thickness greater than the height of gate structure 7. The polysilicon layer can either be doped in situ during deposition via the addition of arsine, or phosphine to a silane ambient, or the polysilicon layer can be deposited intrinsically than subjected to implantation of arsenic or phosphorous ions. An etch back procedure, using $Cl_2$ or $SF_6$ as an etchant for polysilicon, is used to define raised polysilicon source/drain structures 9. The etch back procedure is terminated at the appearance of the top of insulator spacers 8.

The incorporation of the thin strained silicon layer, featuring biaxial tensile strain, results in enhancement of electron transport properties for the N channel device described in this invention. However if desired a P type channel device can also be formed using the thin strained silicon layer, allowing the enhancement of hole transport properties to be realized via use of the biaxial tensile strained region. If the P type channel device is desired, raised source/drain structures 9, would be doped P type, in addition to the P type doping of gate structure 7.

While this invention has been particularly shown and described with reference to the preferred embodiments thereof, it will be understood by those skilled in the art that various changes in form and details may be made without departing from the spirit and scope of this invention.

What is claimed is:

1. A method of forming a strained semiconductor layer, comprising the steps of:
    providing a first wafer with a surface comprising of a first semiconductor layer of a first natural lattice constant, wherein said first semiconductor layer is an alloy semiconductor layer comprising silicon and germanium, with a Ge mole fraction between about 5 to 80%;
    forming a second semiconductor layer with a second natural lattice constant on the first semiconductor layer, said first and second natural lattice constants being different so as to introduce a strain gradient at the interface of said second semiconductor layer and said first semiconductor layer;
    providing a second wafer with a surface with or without an insulator layer;
    bonding said second semiconductor layer on said surface of said second wafer, resulting in a third wafer comprised of said second wafer, said second semiconductor layer, and said first wafer; and
    performing a water jet cleaving procedure at said strain gradient so that said second semiconductor layer is separated from said first semiconductor layer and said first wafer due to cleaving facilitated by said strain gradient.

2. The method of claim 1, wherein said second wafer is a single crystalline silicon substrate.

3. The method of claim 1, wherein said second wafer is a single crystalline silicon substrate with an overlying insulator layer formed on it.

4. The method of claim 3, wherein said insulator layer is a silicon dioxide layer.

5. The method of claim 3, wherein said insulator layer is a silicon nitride layer.

6. The method of claim 1, wherein said first semiconductor layer has a lattice constant greater than that of said second semiconductor layer.

7. The method of claim 1, wherein said first semiconductor layer is epitaxially grown to a thickness between about 0.1 to 10 microns.

8. The method of claim 1, wherein said second semiconductor alloy layer is a silicon layer under tensile strain.

9. The method of claim 1, wherein said second semiconductor layer is a silicon layer, epitaxially grown to a thickness between about 20 to 1000 Angstroms.

10. A method of fabricating a metal oxide semiconductor field effect transistor (MOSFET) device on an insulator layer, featuring a silicon channel region, comprising the steps of:
    providing a first wafer with a surface comprising of a first semiconductor material of a first natural lattice constant, wherein said first semiconductor material is an alloy semiconductor layer that includes silicon and germanium, with a Ge mole fraction between about 5 to 80%;
    forming a second semiconductor layer with a second natural lattice constant on the first semiconductor material so that said second semiconductor layer is strained, said first and second natural lattice constants being different so that a large strain gradient is formed at the interface of said second semiconductor layer and said first semiconductor material;
    providing a second wafer comprising a substrate with an overlying insulator layer;
    bonding said second semiconductor layer on said second wafer, with an insulator in between, resulting in a third wafer comprised of said second wafer, said second semiconductor layer, and said first wafer;
    performing a compressed air or pressurized fluid cleaving procedure at said strain gradient so that said second semiconductor layer is separated from said first semiconductor material due to cleaving facilitated by said strain gradient, resulting in a fourth wafer comprised of said second semiconductor layer and said second wafer; and
    forming a MOSFET device on said fourth wafer, comprising a gate structure and source and drain regions located adjacent to said gate structure.

11. The method of claim 10, wherein said second wafer is a silicon wafer with an insulator formed on it.

12. The method of claim 11, wherein said insulator layer is a silicon dioxide layer.

13. The method of claim 11, wherein said insulator layer is a silicon nitride layer.

14. The method of claim 10, wherein said alloy semiconductor layer has the silicon and germanium thereof in a relaxed state.

15. The method of claim 14, wherein said alloy semiconductor layer is obtained by epitaxial growth procedures.

16. The method of claim 14, wherein said alloy semiconductor layer is epitaxially grown to a thickness between about 0.1 to 10 microns.

17. The method of claim 10, wherein said semiconductor layer is a silicon layer.

18. The method of claim 17, wherein said silicon layer is epitaxially grown to a thickness between about 20 to 1000 Angstroms.

19. A method comprising:
providing a first wafer having a first semiconductor layer with a first natural lattice constant, said first semiconductor layer being an alloy semiconductor layer that includes silicon and germanium, with a Ge mole fraction between about 5 to 80%;
forming a second semiconductor layer with a second natural lattice constant on the first semiconductor layer, said first and second natural lattice constants being different so as to form an interface with a large strain gradient;
bonding a second wafer on said second semiconductor layer; and
directing a pressurized fluid jet at said strain gradient so that said second semiconductor layer is separated from said first semiconductor layer and said first wafer due to cleaving facilitated by said strain gradient.

20. The method of claim 19, wherein bonding the second wafer comprises bonding an insulator layer on the second wafer to the second semiconductor layer of the first wafer.

21. The method of claim 19, wherein providing the first wafer comprises configuring the first wafer to have a silicon substrate, a relaxed SiGe layer formed thereon, and a strained silicon layer formed on the SiGe layer.

* * * * *